United States Patent
Yao

(10) Patent No.: US 10,527,680 B2
(45) Date of Patent: *Jan. 7, 2020

(54) SYSTEMS AND METHODS FOR DETERMINING BATTERY STATE OF CHARGE

(71) Applicant: TEXAS INSTRUMENTS INCORPORATED, Dallas, TX (US)

(72) Inventor: Chidong Yao, Shanghai (CN)

(73) Assignee: Texas Insturments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/352,082

(22) Filed: Nov. 15, 2016

(65) Prior Publication Data

US 2017/0123012 A1 May 4, 2017

Related U.S. Application Data

(63) Continuation of application No. 13/125,532, filed as application No. PCT/CN2009/000822 on Jul. 23, 2009, now Pat. No. 9,494,656.

(51) Int. Cl.
*G01R 31/389* (2019.01)
*G01R 31/367* (2019.01)
*G01R 31/36* (2019.01)

(52) U.S. Cl.
CPC ......... *G01R 31/389* (2019.01); *G01R 31/367* (2019.01); *G01R 31/3647* (2019.01)

(58) Field of Classification Search
CPC ............ G01R 31/3624; G01R 31/3648; G01R 31/3662; H02J 7/007

USPC .......................... 324/434; 320/128, 130, 134
See application file for complete search history.

(56) References Cited

U.S. PATENT DOCUMENTS

| | | | |
|---|---|---|---|
| 6,639,385 B2 | 10/2003 | Verbrugge et al. |
| 7,250,741 B2 | 7/2007 | Koo et al. |
| 7,733,063 B2 | 6/2010 | Mizuno et al. |
| 7,759,901 B2 | 7/2010 | Hirsch et al. |
| 7,808,244 B2 | 10/2010 | Barsukov et al. |

(Continued)

FOREIGN PATENT DOCUMENTS

| | | |
|---|---|---|
| CN | 101131417 A | 2/2008 |
| WO | WO2008117732 A1 | 10/2008 |

OTHER PUBLICATIONS

Search Report for Application No. PCT/CN2009/000822, dated Apr. 29, 2010 (1 page).

(Continued)

*Primary Examiner* — David V Henze-Gongola
(74) *Attorney, Agent, or Firm* — Tunelap Chan; Charles A. Brill; Frank D. Cimino

(57) ABSTRACT

Systems (50, 200) and methods for determining a state of charge of a battery (52, 102, 150, 202) are provided. The system (50, 200) includes a power source (56, 206) configured to provide a charging current to a battery (52, 102, 150, 202). A controller (54, 104, 204) is included and configured to determine a state of charge of the battery (52, 102, 150, 202) based on impedance of a battery (52, 102, 150, 202) during a discharge time period based on an impedance and a state of charge relationship of a battery (52, 102, 150, 202) during a charge time period.

12 Claims, 4 Drawing Sheets

(56) References Cited

U.S. PATENT DOCUMENTS

| | | | |
|---|---|---|---|
| 2002/0014879 A1* | 2/2002 | Koike | H02J 7/0075 320/133 |
| 2003/0112011 A1* | 6/2003 | Guiheen | G01R 31/3624 324/429 |
| 2004/0157113 A1* | 8/2004 | Klang | G01R 31/3648 429/50 |
| 2005/0214633 A1 | 9/2005 | Nakamura et al. | |
| 2006/0284617 A1* | 12/2006 | Kozlowski | B60L 3/0046 324/426 |
| 2007/0252601 A1* | 11/2007 | Satoh | G01R 31/3662 324/431 |
| 2008/0122399 A1* | 5/2008 | Nishino | H02J 7/0075 320/103 |
| 2008/0157778 A1* | 7/2008 | Chou | H02J 7/0047 324/427 |
| 2008/0204031 A1 | 8/2008 | Iwane et al. | |
| 2010/0153038 A1* | 6/2010 | Tomura | G01R 31/3624 702/63 |
| 2012/0086405 A1 | 4/2012 | Shigemizu et al. | |
| 2012/0143585 A1 | 6/2012 | Barsukov et al. | |
| 2012/0194197 A1* | 8/2012 | Crawford | F21L 4/027 324/430 |
| 2012/0323512 A1 | 12/2012 | Rhodin | |

OTHER PUBLICATIONS

Mingyu, et al. "The On-Line Estimating of Remaining Capacity of a Storage Battery," Electrical Measurement and Instrumentation, Sep. 2000, vol. 37, No. 417 (4 pages) (English Machine Translation).

Hongqiao, et al. "Application of the Method Based on Instantaneous High Load Current in Testing Battery Internal Resistance," Telecom Power Technologies, Jan. 25, 2006, vol. 23, No. 1, ISSN 1009-3664 (3 pages) (no English translation available).

* cited by examiner

SYSTEMS AND METHODS FOR DETERMINING BATTERY STATE OF CHARGE

TECHNICAL FIELD

This invention relates to systems and methods for charging a battery, and more specifically, to systems and methods for determining battery state of charge.

BACKGROUND

A battery is two or more electrochemical cells connected in series that store chemical energy and make it available as electrical energy. Common usage has evolved to include a single electrical cell in the definition. There are many types of electrochemical cells, including galvanic cells, electrolytic cells, fuel cells, flow cells, and voltaic piles. A battery's characteristics may vary due to many factors including internal chemistry, current drain, age and temperature.

Batteries can be employed in a wide range of electronic circuits. Some batteries can be recharged. There is a known relationship between a battery's capacity, e.g., its ability to deliver power to a load, and its internal resistance or impedance. Thus, battery impedance monitors can be employed to determine a remaining battery capacity.

SUMMARY

One aspect of the present invention is related to a system for determining a state of charge of a battery. The system comprises a power source configured to provide a charging current to a battery. The system also comprises a controller configured to determine a state of charge based on impedance of a battery during a discharge time period based on an impedance and a state of charge relationship of a battery during a charge time period.

Another aspect of the present invention is related to a system determining a state of charge of a battery. The system comprises a power source configured to provide the battery with a charging current. The system also comprises a controller configured to determine a plurality of impedances of the battery, wherein each impedance of the plurality of impedances corresponds with a given state of charge of the battery.

Yet another aspect of the present invention is related to a method for charging and discharging a battery. A charging current is provided to the battery. An initial state of charge (SOC) is determined for the battery. The battery is charged for a predetermined time interval. A subsequent SOC for the battery is determined. An open circuit voltage (OCV) corresponding to the subsequent SOC of the battery is determined. An impedance for the battery corresponding to the subsequent SOC of the battery is calculated.

DETAILED DESCRIPTION

The present invention relates to an approach for monitoring a state of charge of a battery. The system can measure an initial open circuit voltage of the battery, and determine a corresponding state of charge for the battery. The system can also determine a subsequent state of charge of the battery based on a charging current and the amount of time the battery has been charged. The subsequent state of charge can be employed to determine a corresponding subsequent open circuit voltage, which can in turn be employed to determine a corresponding impedance for the battery. The correspondence between the impedance of the battery and the state of charge of the battery can be stored and employed during a discharge time period (e.g., a discharge cycle) to determine the battery's state of charge.

Figure 1:
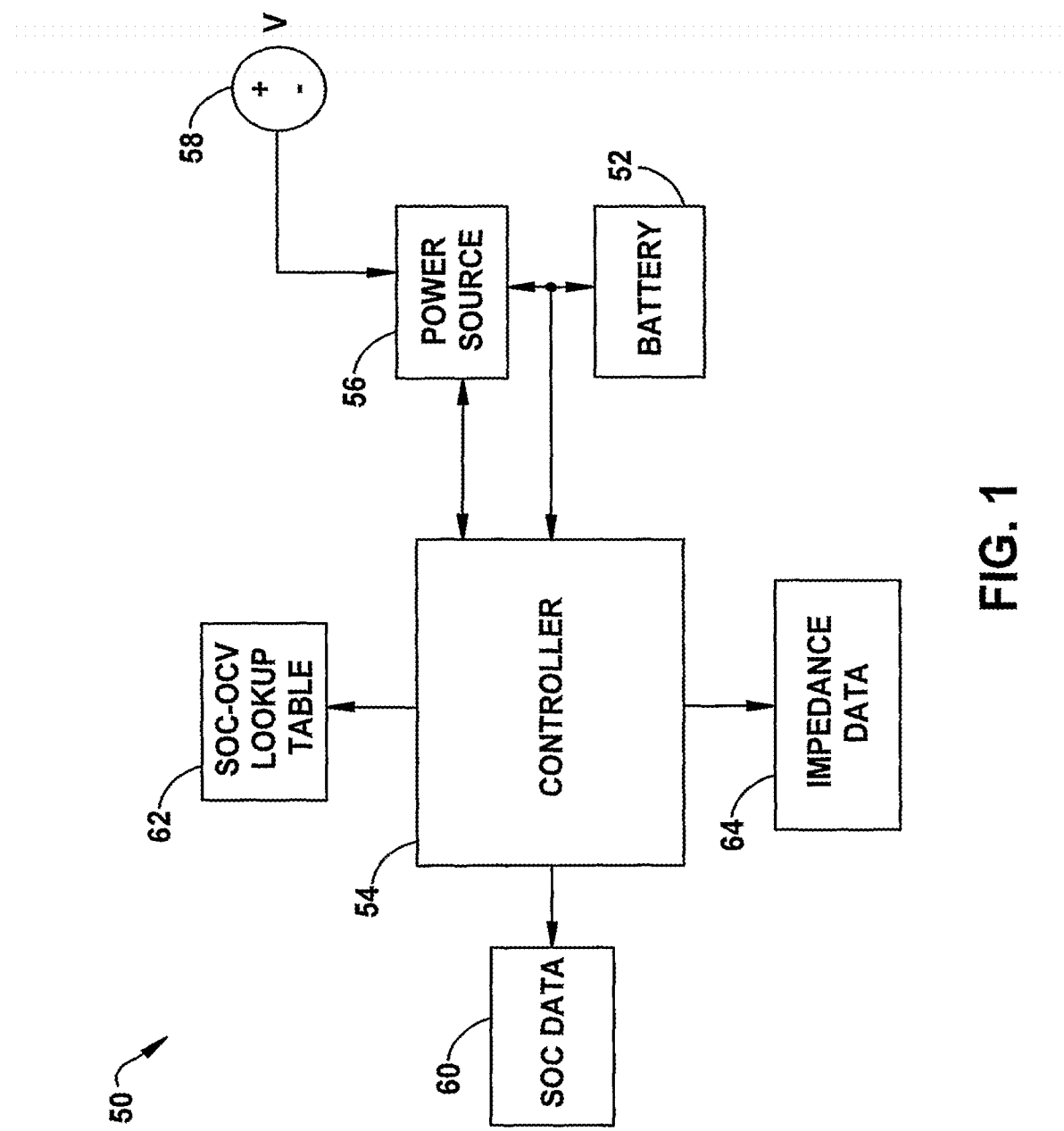
FIG. 1 illustrates a system for determining a state of charge of a battery in accordance with an aspect of the invention.

FIG. 1 illustrates a system 50 for determining a state of charge of a battery 52 in accordance with an aspect of the invention. The system 50 could be implemented, for example, in a laptop computer, a mobile phone, a personal digital assistant (FDA) or the like. The battery 52 could be implemented as a rechargeable battery, such as a lithium ion battery (Li-ion), a lithium ion polymer (Li-ion polymer) a nickel-metal hydride battery (NIMH), a nickel-cadmium battery (Ni-Cad), etc. The system 50 can include a controller 54 that controls a power source 56. The controller 54 and the power source 56 can be implemented, as hardware, software or a combination thereof. Moreover, although FIG. 1 illustrates the controller 54 and the power source 56 being separate entities, one skilled in the art will appreciate that in some implementations, the controller 54 and the power source 56 could be integrated. The power source 56 can provide a power signal to the controller 54. The power source 56 can be coupled to the battery 52. The controller 54 can provide a control signal that controls a current provided to the battery 52. The power source 56 can receive a power signal from an external source, such as a power outlet 58 (e.g., a 110 volt (V) or 220 V alternating current (AC) source).

The power source 56 can provide a direct current (DC) power signal to the controller 54, typically via one of the power outlet 58 and the battery 52, thus providing a power source 56 for the system 50. As is known, typically, the power source 56 and the controller 54 can be configured such that the power signal is provided from the power outlet 58 when the system 50 is connected to the power outlet 58, and the power signal is provided from the battery 52 when system 50 is disconnected from the power outlet 58.

A voltage drop across the battery 52 can be measured and provided to the power source 56 and/or the controller 54. For example, in some implementations, the power source 56 can, for example, detect an analog voltage drop across the battery 52, and convert the analog voltage into a digital signal that characterizes a magnitude and polarity of the analog voltage. In such an implementation, the corresponding digital signal could be provided to the controller 54. Alternatively, the controller 54 could be configured to directly receive the aforementioned analog voltage signal and the controller 54 can convert the analog voltage signal into a digital signal for processing. One skilled in the art will appreciate other ways that the voltage drop across the battery 52 could be measured.

State of charge (SOC) data 60 can be accessed by the controller 54. A battery's SOC can indicate, for example, a potential electrical energy stored by the battery 52. If the battery's 52 SOC at a given time instance is determined, the controller 54 can determined the time remaining (hereinafter, "remaining battery run time") before the battery 52 ceases to provide an adequate current to power the system 50. The remaining battery run time can depend, for example, on the SOC of the battery 52, the output current of the battery 52, the temperature of the battery 52, the age of the battery 52, etc. The SOC data 60 can include, for example, information (e.g., algorithms, look-up tables, etc.) that can be employed by the controller 54 to determine the remaining battery run time for a given SOC of the battery 52. The SOC can be represented, for example, as a percentage (e.g., 0%-100%) of a fully charged state of the battery 52.

When the battery 52 is in a relaxed state (e.g., little or no current drawn from the battery 52), a voltage drop across the battery 52 can be measured by the controller 54. The relaxed state voltage can be referred to as a first Open Circuit Voltage (OCV1). As an example, OCV1 can be about 3 volts (V). The controller 54 can access an SOC-OCV lookup table 62 to determine a first state of charge (SOC1) corresponding to OCV1. The SOC-OCV lookup table 62 can be implemented for example, as a data structure that stores an OCV for discrete SOCs, and vise versa. That is, for every SOC there exists a corresponding OCV. The relationship between OCV and SOC can depend for example, on the particular materials chosen for the battery 52, the age of the battery 52, etc.

The power source 56 can convert an AC signal from the external power outlet 58 into a regulated DC signal that can be provided to the battery 52 and/or the controller 54. The controller 54 can signal the power source 56 to provide a current to battery 52. As an example, the controller 54 can cause the power source 56 to provide a relatively constant current of about 0.5 amperes (A) to the battery 52 at a voltage, for example at about 2 V to about 4 V. After a predetermined time interval (e.g., 5-20 minutes), a subsequent state of charge (SOC2) can be calculated with equation 1:

$$SOC2 = SOC1 + \Delta SOC \qquad \text{Eq. 1}$$

where $\Delta SOC$ is the change in the state of charge of the battery 52 over the predetermined time interval. $\Delta SOC$ can be calculated with equation 2:

$$\Delta SOC = \frac{\int_{t1}^{t2} I \, dt}{FCC} \qquad \text{Eq. 2}$$

where t1 is the is the time at the beginning of the predetermined interval, t2 is the time at the end of the predetermined interval, I is the charging current applied to the battery 52 by the power source 56 and FCC is the full capacity charge of the battery 52.

After calculating SOC2, the controller 54 can query the SOC-OCV lookup table 62 to determine a subsequent OCV corresponding to SOC2, namely OCV2. Additionally, the actual voltage on the battery 52 output Vo can be measured (at about time t2) in a manner described herein. Thus, the impedance for the battery 52 corresponding to SOC2 can be obtained with equation 3:

$$Z_{SOC2} = \frac{Vo - OVC2}{I} \qquad \text{Eq. 3}$$

where $Z_{SOC2}$ is the discharge impedance for the battery 52 corresponding to SOC2. The controller 54 can store $Z_{SOC2}$ in an impedance data structure 64, such as a lookup table or a database. Additionally, the controller 54 can associate SOC2 with $Z_{SOC2}$, such that the SOC for the battery 52 can be determined at a later time by measuring or predicting the impedance of the battery 52. Moreover, in some implementations, the impedance data structure 64 is initialized with a default set of impedances and associated SOCs. In such a situation, the controller 54 can replace a default $Z_{SOC2}$ with the $Z_{SOC2}$ calculated by Equation 3.

It is to be understood and appreciated that the controller 54 can calculate n number of states of charge (SOCn) and an impedance associated with the each of the n number of states of charge ($Z_{SOCn}$) by substantially repeating the above identified process, wherein n is an integer greater than or equal to one. Accordingly, the controller 54 can associate a plurality of impedances with a plurality of SOCs.

Additionally, after one or more impedances are calculated, a scaling factor, $F_{scale}$ can be calculated with Equation 4:

$$F_{scale} = \frac{Z'_{SOCx}}{Z_{SOCx}} \qquad \text{Eq. 4}$$

where $Z'_{SOCx}$ is a calculated impedance associated with a given SOC of the battery 52, namely SOCx, and $Z_{SOCx}$ is the default impedance associated with the given state of charge SOCx. Additionally, it is to be understood that multiple scaling factors ($F_{scale}$) (e.g., 3 or more) can be computed and averaged to increase the accuracy of $F_{scale}$. The controller 54 can employ $F_{scale}$ and a default given impedance $Z_{SOCx}$ to predict an impedance ($Z_{PREDICTEDx}$) associated with the given impedance $Z_{SOCx}$ with equation 5:

$$Z_{PREDICTEDx} = F_{scale} * Z_{SOCx} \qquad \text{Eq. 5}$$

The predicted impedance ($Z_{PREDICTEDx}$) can be employed by the controller 54 in place of a measured impedance ($Z_{SOCx}$) for an associated given default impedance ($Z_{SOCx}$), such that the system 50 need not measure an actual impedance for every impedance stored in the default impedance data structure 64.

The controller 54 can be configured to signal the power source 56 to cease providing the charging current under at least two conditions. The first condition is detecting that the battery 52 has reached an SOC at or near 100%, while the external power outlet 58 is still connected to the system 50. The second condition is a detection of a disconnection from the external power outlet 58.

If the system 50 is disconnected (e.g., unplugged) from the external power outlet 58, the disconnection can be detected, for example, by the power source 56 and/or the controller 54. Upon detection of the disconnection, the controller 54 can signal the power source 56 to cease providing the current to the battery 52. In response, the battery 52 can provide a current to the power source 56 (e.g., the aforementioned power signal) to the controller 54 via the power source 56, thus allowing the system 50 to be operated while disconnected from the external power outlet 58.

As discussed herein, the output voltage at a given time instance of the battery 52 can be measured, for example, by the controller 54 and/or the power source 56. The output voltage can be measured, for example, near the time of the disconnection ($V_{oDISCHARGE}$) (e.g., within about 10 seconds) can be about equal to the OCV for the battery 52 at the same time ($OCV_{DISCHARGE}$). The controller 54 can employ $OCV_{DISCHARGE}$ to determine the associated SOC for the given time instance. As discussed above, the controller 54 can determine the remaining battery run time of the battery 52 by employing the SOC for the given time instance and the SOC data 60. The remaining battery run time can be reported to an end user of the system 50, for example via visual indicia (e.g., a graphical user interface (GUI), one or more light emitting diodes (LEDs), etc.), an audio sensory system (e.g., a loudspeaker) or a tactile sensory system (e.g., a vibrating function), etc.

As the battery 52 is drained, the impedance of the battery 52 increases and the SOC of the battery 52 decreases. After a predetermined time (e.g., about 1-5 minutes) the controller 54 can signal the power source 56 to measure a discharge impedance of the battery 52 ($Z_{DISCHARGE}$). The battery 52 impedance can be measured, for example, with a spectral analysis of a response to a pulse current. The spectral analysis can include, for example a Fourier Transform, a Laplace Transform, etc. In such an implementation, the power source 56 can provide the controller 54 with a digital signal that characterizes $Z_{DISCHARGE}$. $Z_{DISCHARGE}$ can be determined repeatedly, typically at predetermined intervals. One skilled in the art will appreciate that the impedance of the battery 52 could be measured in other ways as well.

The controller 54 can access the impedance data structure 64 to determine an associated SOC for $Z_{DISCHARGE}$. Thus, the controller 54 can update the indication of remaining battery run time. The indication of the remaining battery run time can be updated periodically, typically each time $Z_{DISCHARGE}$ is determined. The system 50 can provide a relatively accurate indication of remaining battery run time without measuring an output current of the battery 52. The output current of the battery 52 typically varies considerably as the power needs of the system 50 change, such as for example, when the system 50 transitions from one mode of operation to another (e.g., from a sleep mode of operation to an active mode of operation).

Figure 2:
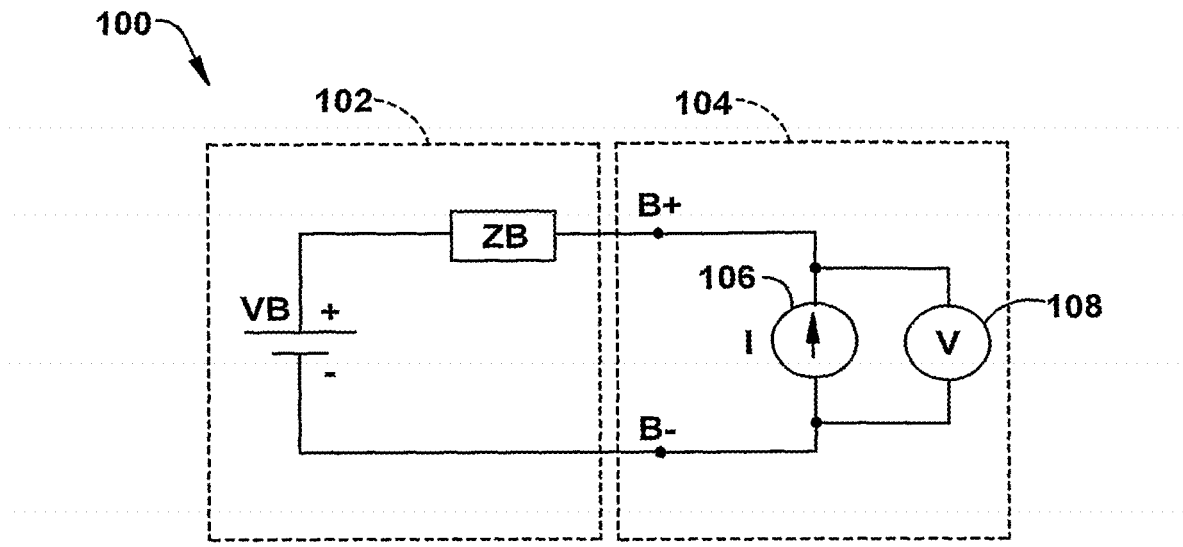
FIG. 2 illustrates an example of a circuit for a system in accordance with an aspect of the invention.

FIG. 2 illustrates an example of a circuit 100 for a system (e.g., the system 50 illustrated in FIG. 1) in accordance with an aspect of the invention. The circuit 100 can include, for example, a battery 102 coupled to a power source 104. The power source 104 can be coupled to the battery 102 at terminals B+ and B−. In the present example, a Thévenin equivalent circuit for the battery 102 can be employed. The Thévenin equivalent circuit of the battery 102 can include, for example, a voltage source VB in series with an equivalent impedance ZB. The power source 104 can include, for example, a current source 106 that provides a current of I (e.g., 0.5 A) in a direction indicated by an arrow, and a voltmeter 108.

The current source 106 can provide, for example, a charging current to the battery 102. The voltmeter 108 can measure, for example, an output voltage (Vo) between terminals B+ and B−. When the battery 102 is in a fully relaxed state (e.g., little or no current is being emitted from the battery 102), Vo can be about equal to an OCV of the battery 102. As discussed herein, the OCV voltage and the measured voltage can be employed to determine an impedance for the battery 102 at predetermined time intervals. Moreover, as discussed herein, the impedance of the battery 102 can be employed to determine a remaining battery run time during a discharge time period of the battery 102.

Figure 3:
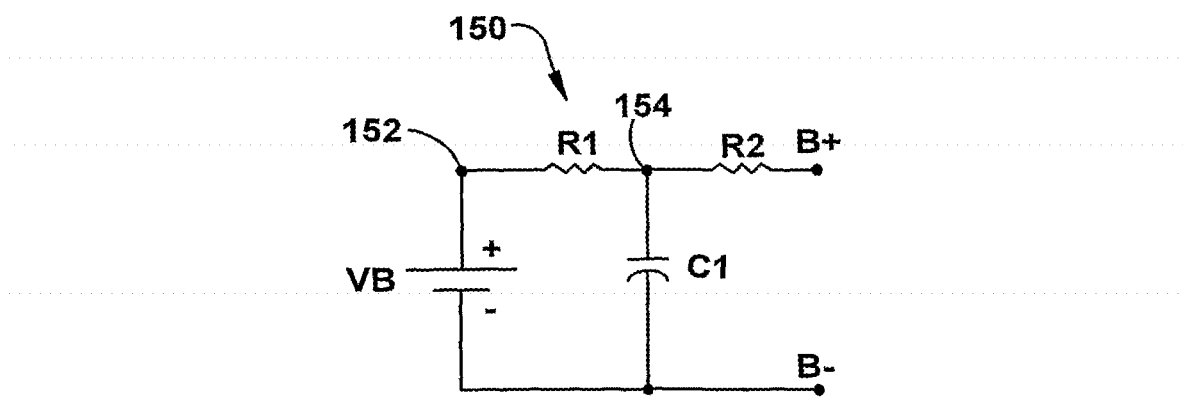
FIG. 3 illustrates an example of an equivalent circuit for a battery.

FIG. 3 illustrates an example of an equivalent circuit for a battery 150 (e.g., the battery 102 illustrated in FIG. 2). The battery 150 can have, for example, positive and negative nodes (e.g., terminals), B+ and B−. The battery 150 can also have a voltage source VB. A negative terminal of the voltage source can be coupled to node B−. A positive terminal of the battery 150 can be coupled (via a node indicated at 152) to a first resistance R1. R1 can also be coupled to a node indicated at 154 that is common to a capacitor C1 and a second resistance R2. C1 can also be coupled to B−, while R2 can also be coupled to B+.

When the battery 150 is in a charging time period, only DC is applied to the battery 150 (e.g., by a power source). If only DC is applied to the battery 150, after an initial transient state (e.g., 10 seconds), the equivalent impedance for the battery 150 will be about equal to R1+R2. Thus, when the battery 150 is fully relaxed, the battery's 150 OCV depends only on the battery's 150 SOC.

Figure 4:
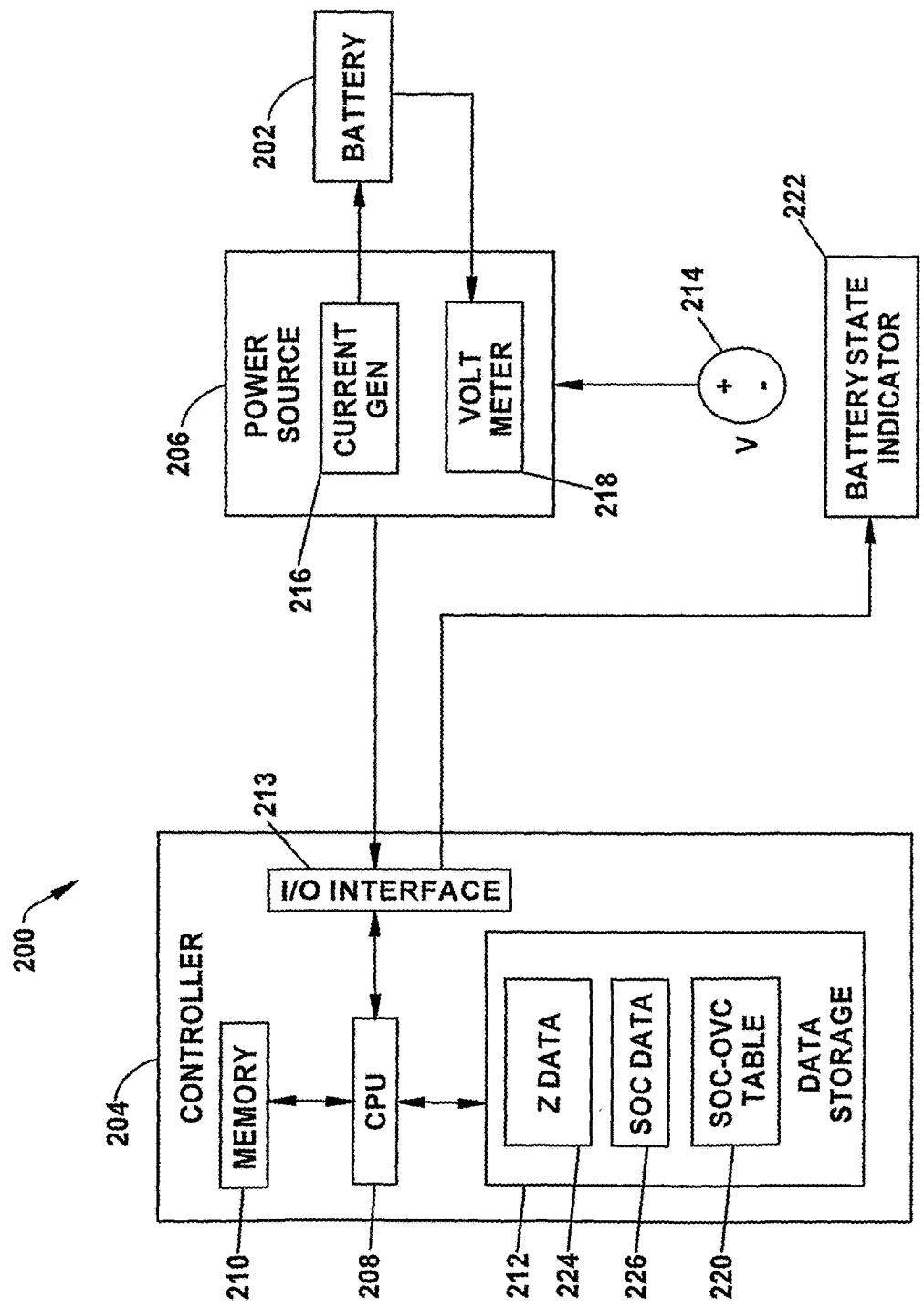
FIG. 4 illustrates another system for determining a state of charge of a battery in accordance with an aspect of the invention.

FIG. 4 illustrates another system 200 for determining a SOC of a battery 202 in accordance with an aspect of the invention. The system 200 could be implemented, for example, as a laptop computer, a PDA, a wireless phone, etc. The system 200 includes a controller 204 coupled to a power source 206 that can charge and discharge the battery 202. The controller 204 can include, for example, a central processing unit (CPU) 208 that can execute computer instructions. The CPU 208 can access a memory 210, such as Random Access Memory (RAM) or Read Only Memory (ROM). The CPU 208 can also read and write data to data storage 212. The data storage 212 could be implemented, for example, as a RAM, a hard disk drive, flash memory, etc. The controller 204 can communicate with external devices (e.g., the power source 206) via an input/output (I/O) interface 213. The I/O interface 213, can include, for example, an analog-to-digital converter (ADC), a digital-to-analog converter (DAC), etc.

The system 200 can be connected to an external power outlet 214 (e.g., an electrical outlet). The external power outlet 214 can provide, for example, a 110 V or 220 V AC signal to the power source 206. The power source 206 can include, for example, a current generator 216 that can provide a current to the battery 202 in response to receiving a control signal from the controller 204. The power source 206 can also include a voltmeter 218 that can measure a voltage drop across the battery 202.

Upon connection to the external power outlet 214, current from the battery 202 can be reduced to about zero, causing the battery 202 to transition to a relaxed state. The voltmeter 218 can measure the voltage across the battery 202 in the relaxed state, which can be referred to as OCV1. As an example, OCV1 can be about 3 V. The power source 206 can provide the controller 204 with a signal that corresponds to OCV1. The signal can be, for example an analog signal that is received at the I/O interface 213. In such an implementation, the I/O interface 213 can convert the analog signal to a digital signal that characterizes the magnitude and polarity of OCV1. The controller 204 (e.g., via the CPU 208 and the I/O interface 213) can signal the power source 206 to provide a charging current to the battery 202 from the current generator 216. As an example, the charging current can be implemented as a power signal with a current of about 0.5 A at a voltage of about 2 V to about 4 V.

The data storage 212 can include, for example, an SOC-OCV lookup table 220 that stores a relationship between the battery's 202 OCV and the battery's 202 SOC. The SOC-OCV table 220 could be filled, for example, with default values. Thus, the CPU 208 can determine the battery's 202

SOC in the relaxed state, which can be referred to as SOC1. The SOC can be, for example, a percentage between 0% and 100% that indicates the amount of potential electrical energy stored in the battery 202. The CPU 208 can report the SOC of the battery 202 during charging, for example, to an end user of the system 200 via a battery state indicator 222. The battery state indicator 222 can be, for example, a visual indicator (e.g., an icon of a GUI, one or more LEDs, etc.), an audio indicator (e.g., a loudspeaker), a tactile indicator (e.g., a vibration mechanism), etc.

After a predetermined amount of time, the CPU 208 can calculate a subsequent SOC, namely SOC2, with an algorithm that employs, for example, Equations 1 and 2. Upon calculating SOC2, the CPU 208 can query the SQC-OCV lookup table 220 to determine a subsequent OCV corresponding to SOC2, which can be referred to as OCV2. Upon determining OCV2, the actual voltage Vo across the battery 202 can be re-measured by the voltmeter 218 and reported to the CPU 208 via the I/O interface 213. Upon determining Vo and OCV2, an impedance of the battery 202 for SOC2, referred to as $Z_{SOC2}$ can be calculated by the CPU 208 employing Equation 3.

The CPU 208 can store a relationship between the battery 202 impedance and an SOC as impedance data 224 in the data storage 212. The impedance data 224 can be configured to include default values that establish a predefined relationship between the battery 202 impedance and the battery's 202 SOC. Upon determining $Z_{SOC2}$, the CPU 208 can replace the existing relationship for the determined impedance and the battery's 202 SOC. Upon calculating the battery 202 impedance, the CPU 208 can employ an algorithm that employs Equation 4 to determine a scaling factor ($F_{scale}$) for the battery 202. $F_{scale}$ can be employed by the CPU 208 to predict an impedance ($Z_{PREDICTED}$) for a given default impedance, $Z_{SOCx}$ with Equation 5.

The system 200 can be configured to repeat the process of determining the battery 202 impedance for other SOCs periodically (e.g., every 5-20 minutes), and store the relationship in between the determined impedance and the associated SOC in the impedance data 224. Additionally, when an SOC is determined by the CPU 208, the battery state indicator 222 can be updated by the CPU 208 accordingly. Moreover, the CPU 208 can employ the determined battery impedances to determine multiple scaling factors ($F_{scale}$) that can be averaged to increase the accuracy of predicted impedances.

When the battery 202 is charged to a desired SOC, the system 200 can be disconnected (e.g., unplugged) from the external power outlet 214. The disconnection can be detected, for example, by the power source 206 and/or the CPU 208. Upon detection of the disconnection, the CPU 208 can signal the power source 206 (via the I/O interface 213) to discontinue providing the charging current to the battery 202. In response, the battery 202 can provide a current to the power source 206 (e.g., a power signal), which can be forwarded to the controller 204. Thus, the system 200 can be operated while disconnected from the external power outlet 214.

The output voltage of the battery 202 for a given time instance can be measured, for example, by the voltmeter 218 and provided to the CPU 208. The CPU 208 can signal the power source 206 to measure the output voltage of the battery 202 at about the time of the disconnection (e.g., within 10 seconds), which can be referred to as $Vo_{DISCHARGE}$. $Vo_{DISCHARGE}$ can be about equal to the OCV of the battery 202 at the same time, which can be referred to as $OCV_{DISCHARGE}$. The CPU 208 can employ $OCV_{DISCHARGE}$ to determined the associated SOC of the battery 202 at about the time of the disconnection.

The CPU 208 can determine the remaining run time of the battery 202 by employing a given SOC for a given time instance by employing SOC data 226 that can be stored in the data storage 212. The remaining run time of the battery 202 can be based, for example, on the SOC, the operating mode of the system 200, the age of the battery 202, etc. The remaining battery run time can be reported to the end user of the system 200 via the battery state indicator 222.

As the battery 202 is drained, the impedance of the battery 202 increases, and the SOC of the battery 202 decreases. At periodic time intervals (e.g., about 1-5 minutes), the CPU 208 can calculate a discharge impedance, $Z_{DISCHARGE}$. $Z_{DISCHARGE}$ can be calculated, for example, with spectral analysis of a response to a pulse current (e.g., provided by the current generator 216). In such an implementation, the voltmeter 218 can provide the CPU 208 with a digital signal that represents the response to the pulse current. The CPU 208 can employ known algorithms to determine $Z_{DISCHARGE}$. One skilled in the art will appreciate the variety of other possible methods that $Z_{DISCHARGE}$ measured and/or calculated.

The CPU 208 can access the data storage 212 to determine an SOC for the calculated $Z_{DISCHARGE}$. Upon determination of the SOC, the battery state indicator 222 can be updated to reflect the present remaining battery run time. The system 200 can provide a relatively accurate indication of the remaining battery run time without measuring the output current of the battery 202, which is known to vary greatly throughout the discharge time period.

In view of the foregoing structural and functional features described above, methodologies will be better appreciated with reference to FIG. 4. It is to be understood and appreciated that the illustrated actions, in other embodiments, may occur in different orders and/or concurrently with other actions. Moreover, not all illustrated features may be required to implement a method.

Figure 5:
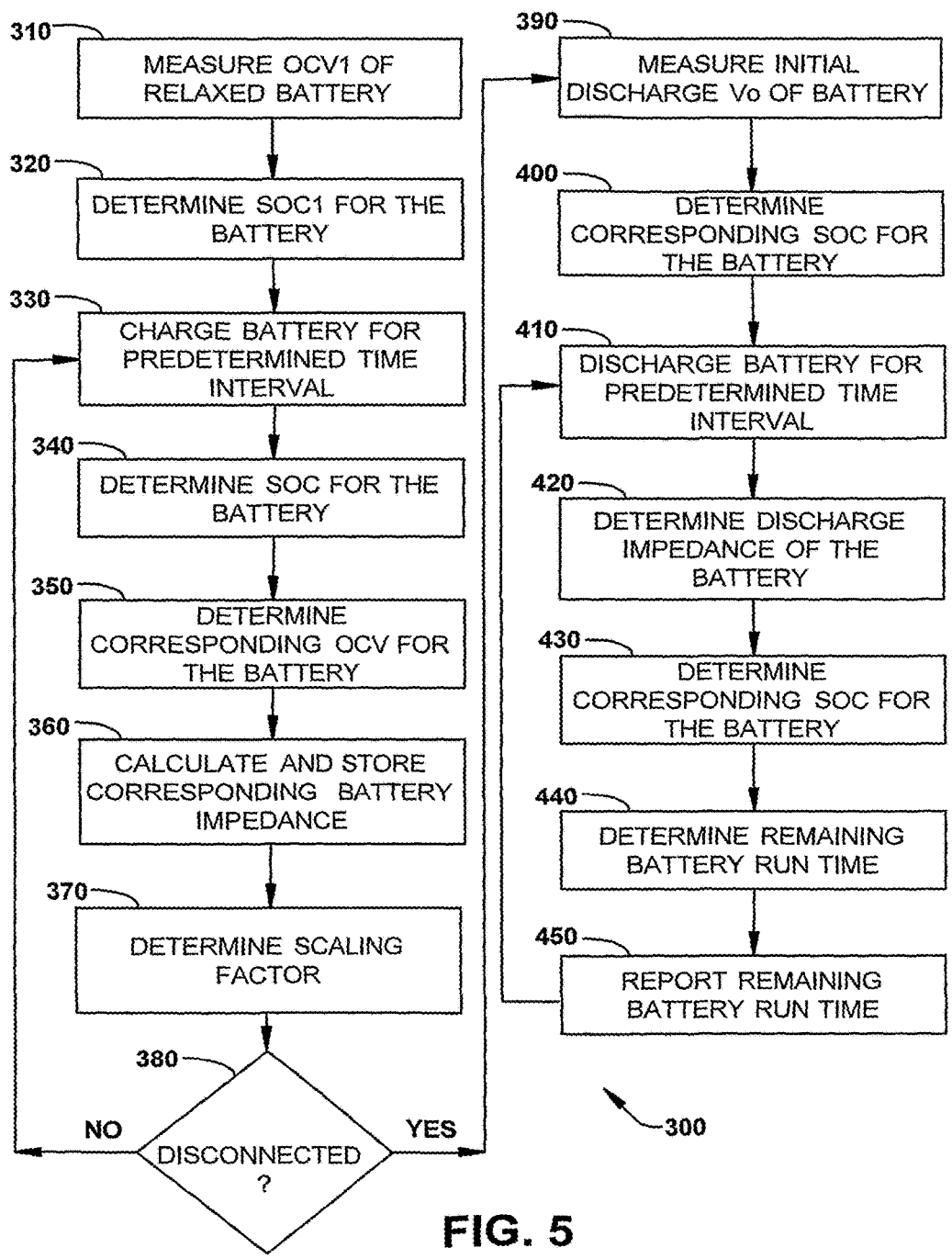
FIG. 5 illustrates a flow chart for a methodology for determining a state of charge of a battery in accordance with an aspect of the invention.

FIG. 5 illustrates a flow chart for a methodology 300 for determining a state of charge of a battery in accordance with an aspect of the present invention. At 310, an initial OCV, OCV1 of the battery can be measured, for example, by a power source and the power source can provide a controller with a signal that characterizes the measured OCV1. At 320, the controller can access an SOC-OCV lookup table to determine an SOC corresponding to OCV1.

At 330, the controller can signal the power source to provide the battery with a current for a predetermined time interval, thereby charging the battery for the predetermined time interval. At 340, the controller can use an algorithm to determine the SOC for the battery after the predetermined interval. At 350, the controller can access the SOC-OCV table to determine a corresponding OCV for the determined SOC. At 360, the battery impedance corresponding to the determined SOC is calculated and stored by the controller. The battery impedance and the corresponding SOC can be stored, for example, as impedance data. The impedance data can be pre-loaded, for example, with default values. At 370, the controller employs one or more calculated impedances to determine a scaling factor that can be employed to scale a default impedance to predict an impedance.

At 380, a determination is made as to whether a disconnection from an external power outlet has been detected. The disconnection can be detected, for example, by the controller and/or the power source. If the determination is negative (e.g., NO), the methodology returns to 330. If the determination is positive, (e.g., YES) the methodology proceeds to 390.

At 390, an initial discharge output voltage (Vo) of the battery can be measured by a voltmeter, and a signal characterizing the measured voltage can be provided to the controller. The initial discharge Vo can be about equal to the OCV for the battery near the time that the disconnection is detected. At 400, the controller can determine an SOC for the battery corresponding to the OCV of the battery.

At 410, the battery is discharged for a predetermined time interval. At 420, a discharge impedance of the battery can be measured by the power source and the controller. The impedance can be measured and/or calculated, for example, by the power source providing a current pulse to the battery, and the power source detecting a response to the current pulse. The power source can provide the controller with a signal that characterizes the response to the current pulse as response data. The controller can employ the response data to calculate the impedance for the battery. At 430, the controller can access the impedance data to determine a corresponding SOC for the determined impedance. At 440, the controller can employ SOC data to determine the remaining battery run time. At 450, the controller can report the remaining battery run time to an end user of the system, for example via a battery status indicator, and the methodology 300 can return to 410.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the scope of the appended claims.

What is claimed is:

1. A device comprising:
   a power source configured to provide a charging current to a battery;
   a memory storing a first impedance directly associated with a first state of charge (SOC) of a battery, the first SOC corresponding to a charging state of the battery after receiving the charging current; and
   a controller coupled to the memory, and configured to:
      determine a second impedance of the battery during a discharge state of the battery;
      determine whether the second impedance directly corresponds to the first impedance; and
      determine a second SOC of the battery during the discharge state based on the first SOC of the battery when the second impedance directly corresponds to the first impedance.

2. The device of claim 1, wherein the first impedance of the battery during the charging state is determined based on a measured voltage of the battery during the charging state, the charging current, an initial SOC of the battery before receiving the charging current, and a change of SOC after receiving the charging current.

3. The device of claim 1, wherein the controller is configured to determine a third impedance of the battery during the charging state to determine an average scaling factor for the battery.

4. The device of claim 1, wherein the controller is configured to:
   determine a change of SOC from an initial SOC based on the charging current, a charging time, and a full capacity charge (FCC) parameter of the battery;
   determine the first SOC by adding the change of SOC to the initial SOC;
   associate the first SOC to an open circuit voltage of the battery; and
   determine the first impedance based on a difference between a measured voltage of the battery during the charging state and the open circuit voltage.

5. The device of claim 4, wherein the memory stores a lookup table directly corresponding the first SOC to the open circuit voltage, and the controller is configured to access the lookup table to associate the first SOC to the open circuit voltage.

6. The device of claim 1, wherein the controller is configured to determine a remaining battery run time of the battery based on the second SOC of the battery.

7. A device comprising:
   a power source configured to provide the battery with a charging current; and
   a memory storing an initial state of charge (SOC) of a battery before the battery receiving the charging current; and
   a controller coupled to the memory, and configured to:
      determine a change of SOC from the initial SOC based on the charging current, a charging time, and a full capacity charge (FCC) parameter of the battery;
      determine a charging SOC by adding the change of SOC to the initial SOC;
      associated the charging SOC to an open circuit voltage of the battery; and
      determine a charging impedance of the battery based on the charging current and a difference between a measured voltage of the battery during the charging state and the open circuit voltage.

8. The device of claim 7, wherein the memory stores a lookup table directly corresponding the first SOC to the open circuit voltage, and the controller is configured to access the lookup table to associate the first SOC to the open circuit voltage.

9. The device of claim 8, wherein the controller is configured to:
   determine a discharging impedance of the battery during a discharge state of the battery;
   determine whether the discharging impedance directly corresponds to the charging impedance; and
   determining a discharging SOC of the battery during the discharge state based on the charging SOC of the battery when the discharging impedance directly corresponds to the charging impedance.

10. A method for determining a state of charge of a battery, the method comprising:
    providing a charging current to the battery;
    determining an initial state of charge (SOC) of the battery;
    charging the battery with the charging current for a predetermined time interval;
    determining a first SOC of the battery based on the initial SOC, the charging current, and the predetermined time interval;
    determining a first impedance for the battery based on and corresponding to the first SOC of the battery;
    discharging the battery during a discharge time period;
    determining a second impedance of the battery during the discharge time period;

determine whether the second impedance directly corresponds to the first impedance; and determining a second SOC of the battery based on the first SOC of the battery when the second impedance directly corresponds to the first impedance.

11. The method of claim 10, further comprising storing, in a memory, the first impedance and the first SOC; and associating, in the memory, the first impedance to the first SOC.

12. The method of claim 10, wherein the determining the first impedance includes:

associating the first SOC to an open circuit voltage of the battery; and determining the first impedance based on a difference between a measured voltage of the battery during the charging state and the open circuit voltage.

* * * * *